(12) United States Patent
Bouche et al.

(10) Patent No.: US 9,412,655 B1
(45) Date of Patent: Aug. 9, 2016

(54) FORMING MERGED LINES IN A METALLIZATION LAYER BY REPLACING SACRIFICIAL LINES WITH CONDUCTIVE LINES

(71) Applicant: GLOBALFOUNDRIES Inc., Grand Cayman (KY)

(72) Inventors: Guillaume Bouche, Albany, NY (US); Jason E. Stephens, Albany, NY (US); Vikrant Chauhan, Clifton Park, NY (US); Andy C. Wei, Queensbury, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/608,377

(22) Filed: Jan. 29, 2015

(51) Int. Cl.
*H01L 21/768* (2006.01)
*H01L 21/311* (2006.01)
*H01L 21/3213* (2006.01)
*H01L 21/3105* (2006.01)
*H01L 21/02* (2006.01)
*H01L 21/308* (2006.01)
*H01L 21/033* (2006.01)

(52) U.S. Cl.
CPC ...... *H01L 21/76877* (2013.01); *H01L 21/0217* (2013.01); *H01L 21/02164* (2013.01); *H01L 21/0334* (2013.01); *H01L 21/3081* (2013.01); *H01L 21/3086* (2013.01); *H01L 21/3088* (2013.01); *H01L 21/31053* (2013.01); *H01L 21/31144* (2013.01); *H01L 21/32139* (2013.01); *H01L 21/76802* (2013.01); *H01L 21/76831* (2013.01)

(58) Field of Classification Search
None
See application file for complete search history.

(56) References Cited

U.S. PATENT DOCUMENTS

| | | | | |
|---|---|---|---|---|
| 2006/0014344 A1* | 1/2006 | Manning | ......... | H01L 28/91 438/243 |
| 2008/0076244 A1* | 3/2008 | Ye | ......... | H01L 21/31144 438/597 |
| 2014/0054534 A1* | 2/2014 | Pellizzer | ......... | H01L 45/06 257/4 |
| 2015/0243515 A1* | 8/2015 | Yuan | ......... | H01L 21/0274 438/666 |
| 2015/0380256 A1* | 12/2015 | Chang | ......... | H01L 21/3081 438/702 |

* cited by examiner

*Primary Examiner* — Michael Jung
(74) *Attorney, Agent, or Firm* — Amerson Law Firm, PLLC

(57) ABSTRACT

A method includes forming a plurality of sacrificial lines embedded in a first dielectric layer. A line merge opening and a line cut opening are formed in a hard mask layer formed above the first dielectric layer. Portions of the first dielectric layer exposed by the line merge opening are removed to define a line merge recess. A portion of a selected sacrificial line exposed by the line cut opening is removed to define a line cut recess between first and second segments of the selected sacrificial line. A second dielectric layer is formed in the line cut recess. The hard mask is removed. The plurality of sacrificial lines is replaced with a conductive material to define at least one line having third and fourth segments in locations previously occupied by the first and second segments and to define a line-merging conductive structure in the line merge recess.

20 Claims, 17 Drawing Sheets

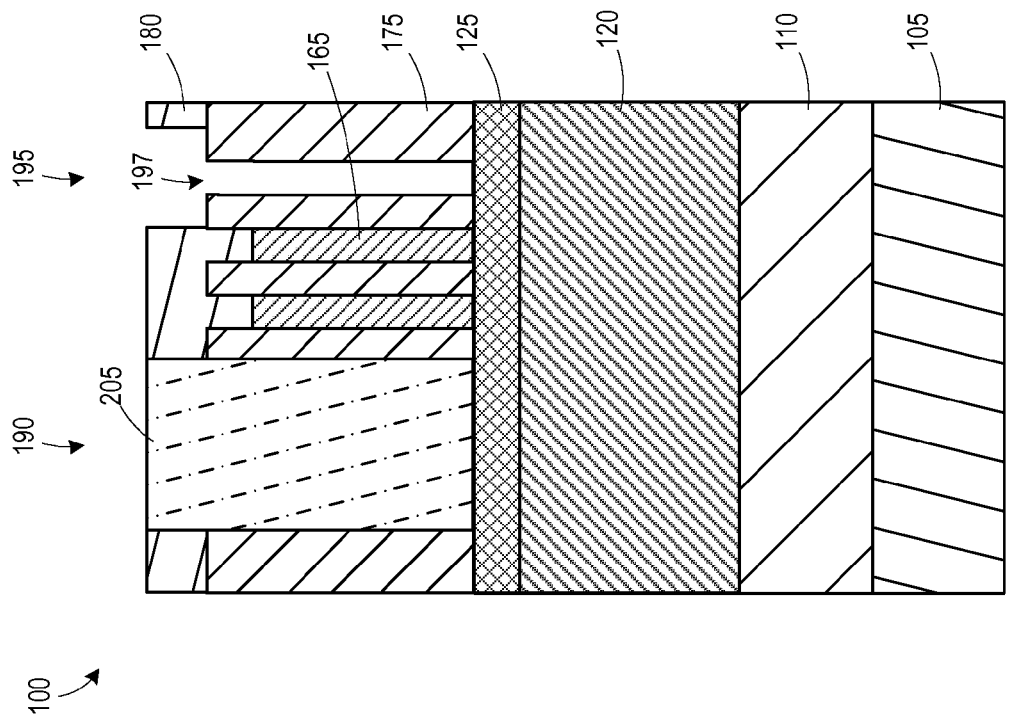
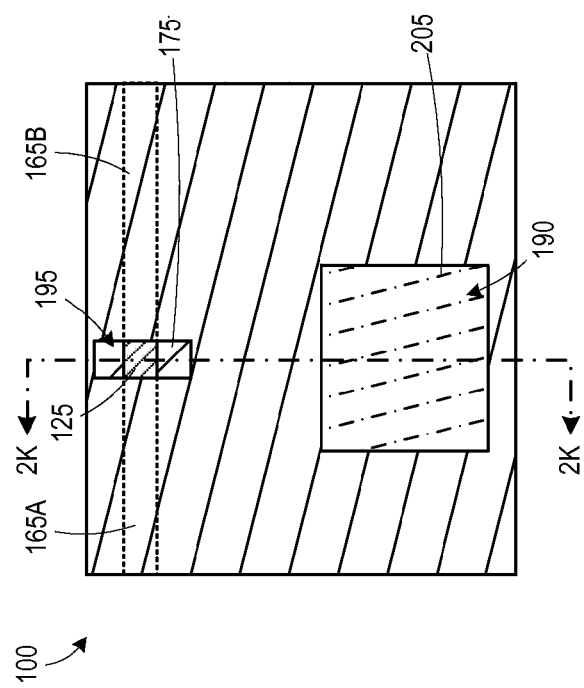

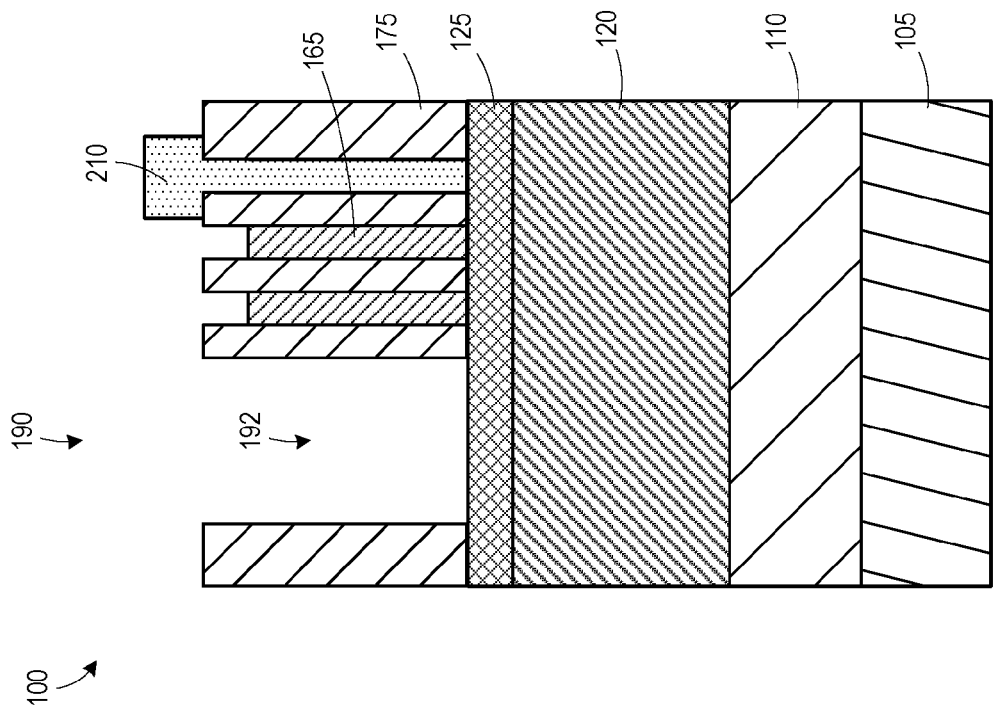
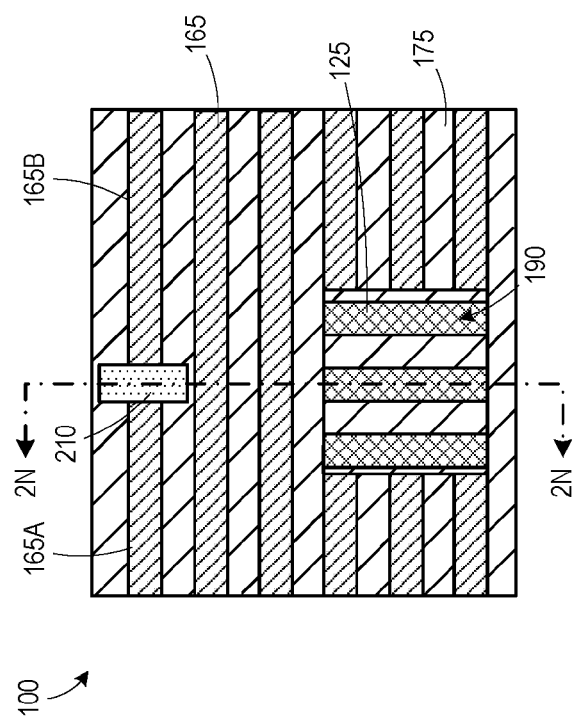

FORMING MERGED LINES IN A METALLIZATION LAYER BY REPLACING SACRIFICIAL LINES WITH CONDUCTIVE LINES

BACKGROUND OF THE INVENTION

1. Field of the Invention

The present disclosure generally relates to the fabrication of semiconductor devices, and, more particularly, to forming merged lines in a metallization layer.

2. Description of the Related Art

In modern integrated circuits, minimum feature sizes, such as the channel length of field effect transistors, have reached the deep sub-micron range, thereby steadily increasing performance of these circuits in terms of speed and/or power consumption and/or diversity of circuit functions. As the size of the individual circuit elements is significantly reduced, thereby improving, for example, the switching speed of the transistor elements, the available floor space for interconnect lines electrically connecting the individual circuit elements is also decreased. Consequently, the dimensions of these interconnect lines and the spaces between the metal lines have to be reduced to compensate for a reduced amount of available floor space and for an increased number of circuit elements provided per unit area.

Traditionally, metallization layers, i.e., the wiring layers including metal lines and vias for providing the electrical connection of the circuit elements according to a specified circuit layout, are formed by embedding copper lines and vias in a dielectric layer stack. For highly sophisticated applications, in addition to using copper and/or copper alloys, the well-established and well-known dielectric materials silicon dioxide (k≈4.2) and silicon nitride (k>7) may increasingly be replaced by so-called low-k dielectric materials having a relative permittivity of approximately 3.0 and less. Copper lines and vias are typically formed by performing well-known damascene (single or dual) processes whereby trenches or openings are formed in a layer of insulating material. Thereafter, barrier layers are deposited in the trenches or openings followed by over-filling the trenches or openings with copper material. Next, a planarization process is performed to remove the excess materials above the insulating material, thereby leaving the resulting line or via positioned in the previously formed trench or opening.

In the case of copper lines, the width of the lines is typically limited by the photolithography processes used to pattern the trenches in the layer of insulating material. In the case where the lines are formed of a material that may be directly patterned, e.g., tungsten, the width of the patterned lines is still limited by photolithography processes. To improve the reliability of the patterning process, a large number of evenly spaced lines are typically formed in a regular pattern. The width of each line and the pitch between lines is determined by the patterning process. In an exemplary self-aligned technique, referred to as self-aligned double patterning (SADP), a hard mask layer is formed above a dielectric layer and a plurality of mandrel line elements is formed above the hard mask layer. Spacers are formed on sidewalls of the mandrel and the mandrel is removed, leaving the spacers as an etch mask for patterning the hard mask layer. The pitch of the spacers is effectively double that of the mandrel elements. Another technique, referred to as self-aligned quadruple patterning (SAQP) forms another set of spacers and removes the first set, effectively quadrupling the pitch of the mandrel elements. The patterned hard mask layer is used to etch trenches in the underlying dielectric layer, and the trenches are filled with metal to form the interconnect lines.

Due to the regular nature of the spacers and the self-aligned process, it is inherently difficult to pattern trenches with widths greater than the characteristic width of the patterning process, referred to as the 1× width. The patterning of wider lines, such as those needed for high current capacity power rails, typically requires additional masking and patterning steps, giving rise to increased fabrication complexity and cost.

The present disclosure is directed to various methods of forming merged lines in a metallization layer that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming merged lines in a metallization layer. A method includes, among other things, forming a plurality of sacrificial lines embedded in a first dielectric layer formed above a substrate. A hard mask layer is formed above the first dielectric layer and the plurality of sacrificial lines. A line merge opening and a line cut opening are formed in the hard mask layer. Portions of the first dielectric layer exposed by the line merge opening are removed to define a line merge recess. A portion of a selected sacrificial line exposed by the line cut opening is removed to define a line cut recess between first and second segments of the selected sacrificial line. A second dielectric layer is formed in the line cut recess. The hard mask is removed. The plurality of sacrificial lines is replaced with a conductive material to define at least one line having third and fourth segments in locations previously occupied by the first and second segments, respectively, of the selected sacrificial line and to define a line-merging conductive structure in the line merge recess.

Another illustrative method includes, among other things, forming a plurality of sacrificial lines embedded in a first dielectric layer formed above a substrate. A hard mask layer is formed above the first dielectric layer and the plurality of sacrificial lines. First and second openings are formed in the hard mask layer. A spacer layer is formed above the hard mask layer and at least partially in the first and second openings. The spacer layer is removed in the first opening while leaving a remainder portion of the spacer layer disposed in the second opening. Portions of the first dielectric layer exposed by the first opening are removed to define a line merge recess. The remainder portion of the spacer layer disposed in the second opening is removed. A portion of a selected sacrificial line exposed by the second opening is removed to define a line cut recess between first and second segments of the selected sacrificial line. A second dielectric layer is formed in the line cut recess. The plurality of sacrificial lines is replaced with a conductive material to define at least one line having third and fourth segments in locations previously occupied by the first and second segments, respectively, of the selected sacrificial line and to define a line-merging conductive structure in the line merge recess.

BRIEF DESCRIPTION OF THE DRAWINGS

The disclosure may be understood by reference to the following description taken in conjunction with the accompanying drawings, in which like reference numerals identify like elements, and in which.

Figure 1A:
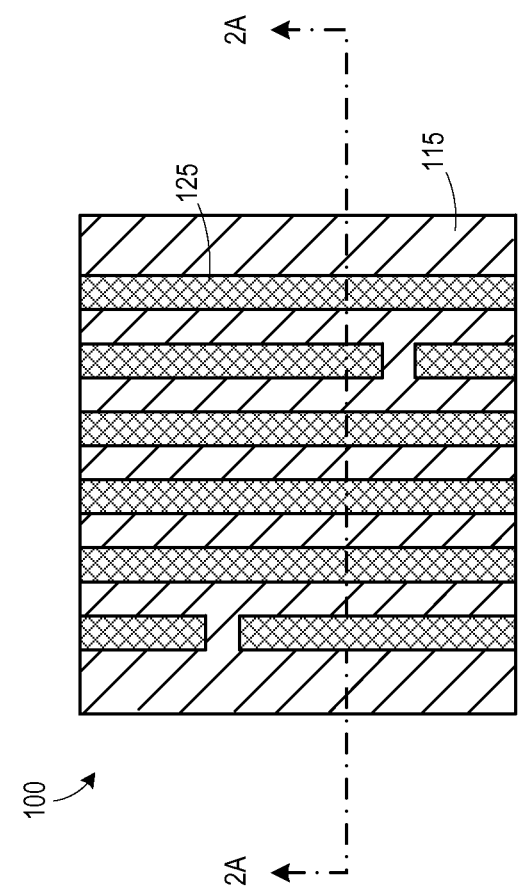
FIGS. 1A-1Q are top views of a device depicting various illustrative methods disclosed herein for forming merged lines and cut lines.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming merged lines in a metallization layer. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

Figure 2A:
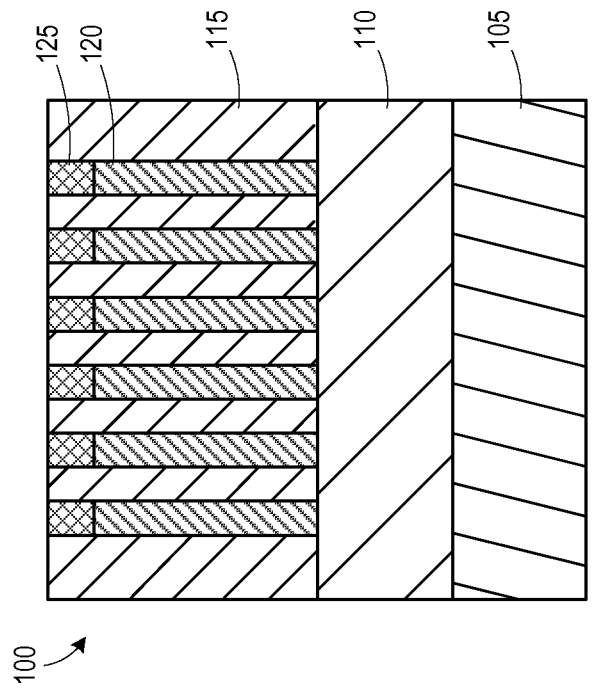
FIGS. 2A-2Q are cross-sectional views of the device corresponding to FIGS. 1A-1Q.

FIGS. 1A-1Q and 2A-2Q illustrate a method for forming merged lines and cut lines in a device 100 using a combined etch mask. FIG. 1A shows a top view of the device 100 and FIG. 2A shows a corresponding cross-sectional view of the device 100 taken along line 2A in FIG. 1A. The device 100 includes a substrate 105. A device layer 110 is disposed above the substrate 105. Semiconductor-based circuit elements, such as transistors, resistors, capacitors, etc., may be formed in and above the substrate 105. The device layer 110 also typically includes conductive contacts that interface with these circuit elements. For convenience, any such circuit elements and contacts are not shown in FIG. 2A. The substrate 105 may also include any appropriate microstructure features, such as micromechanical components, optoelectronic components and the like, wherein at least some of these components may require an interconnect structure formed in a metallization system.

A dielectric layer 115 is formed above the device layer 110 (e.g., in a Metal 1 (M1) layer). The dielectric layer 115 may be a low-k dielectric material having a dielectric constant of approximately 3.0 or lower or an ultra-low-k (ULK) material having a dielectric constant of approximately 2.5 or lower. In some embodiments, the dielectric layer 115 may be SiOC. Conductive lines 120 (e.g., copper) with a cap layer 125 (e.g., silicon nitride) are formed in the dielectric layer 115. The conductive lines 120 may include multiple layers, such as one or more barrier layers (e.g., Ta, TaN, TiN, etc.) to prevent migration of any metal in the conductive lines 120 into the dielectric layer 115, a metal seed layer (e.g., copper), and a metal fill material (e.g., copper).

Figure 2B:
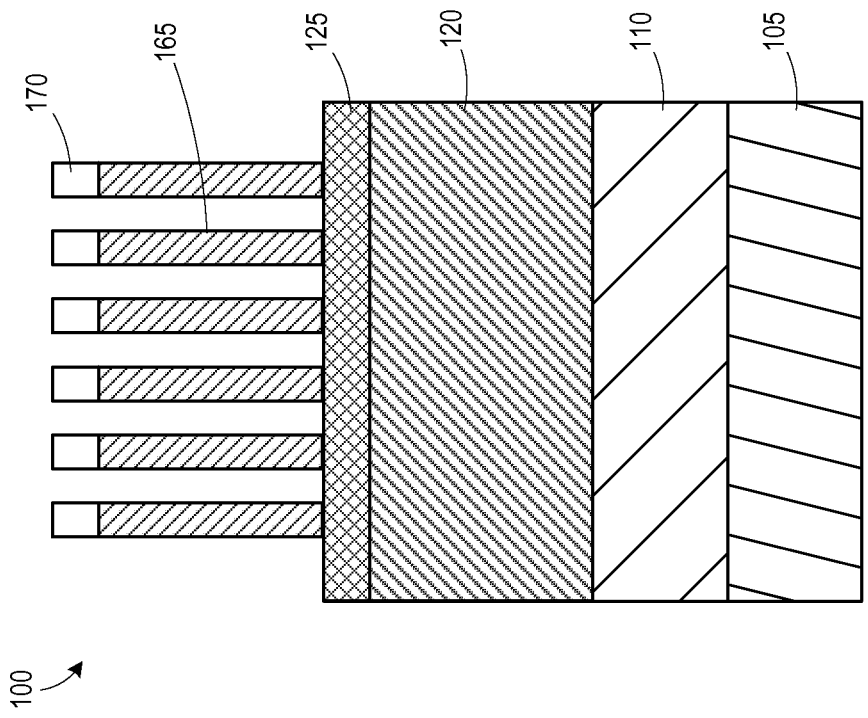
Figure 1B:
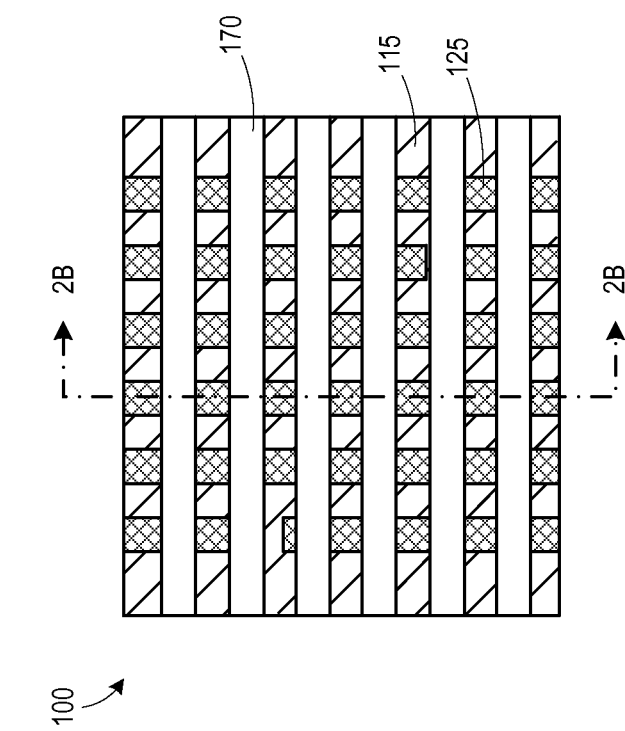

FIGS. 1B and 2B illustrate a top view and a cross-section view (along line 2B), respectively, of the device 100 after a plurality of processes were performed so as to form a set of sacrificial lines 165, each having a cap layer 170 (e.g., silicon nitride) formed thereabove. The sacrificial lines 165 are oriented perpendicularly with respect to the conductive lines 120 illustrated in FIG. 1A. The sacrificial lines 165 may be formed by patterning a layer of sacrificial material (e.g., amorphous silicon) using the cap layer 170 as a hard mask for a patterning process (e.g., self-aligned double patterning (SADP), self-aligned quad patterning (SAQD), or directed self-assembly material patterning), the specifics of which are known to those of ordinary skill in the art.

Figure 2C:
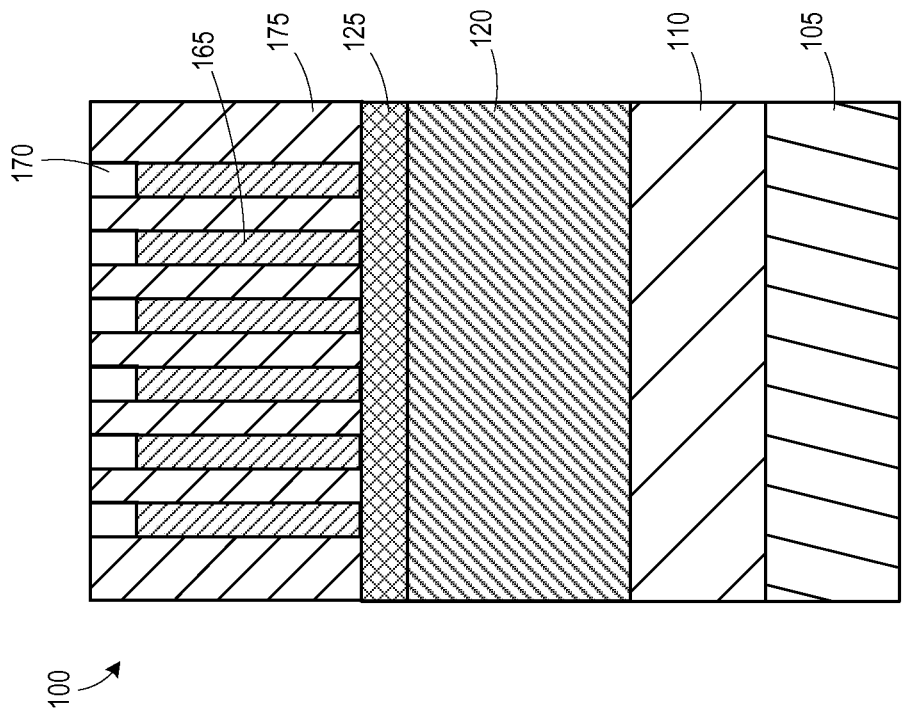
Figure 1C:
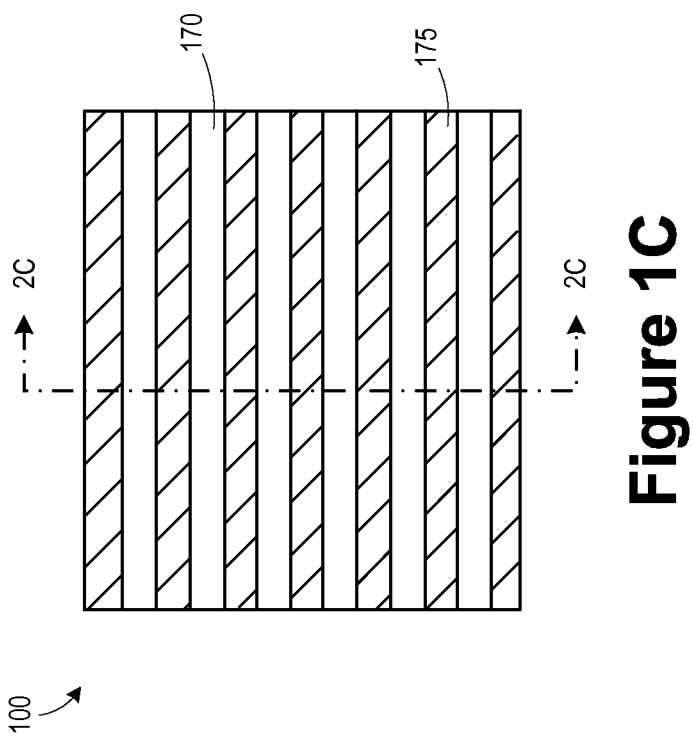

FIGS. 1C and 2C illustrate a top view and a cross-section view (along line 2C), respectively, of the device 100 after a plurality of processes were performed so as to deposit a second dielectric layer 175 (e.g., in a Metal 2 (M2) layer) above the sacrificial lines 165, and to planarize the second dielectric layer 175 using the cap layer 170 as a stop layer. In some embodiments, the material of the second dielectric layer 175 may be the same as that of the first dielectric layer 115 (e.g., SiOC).

Figure 2D:
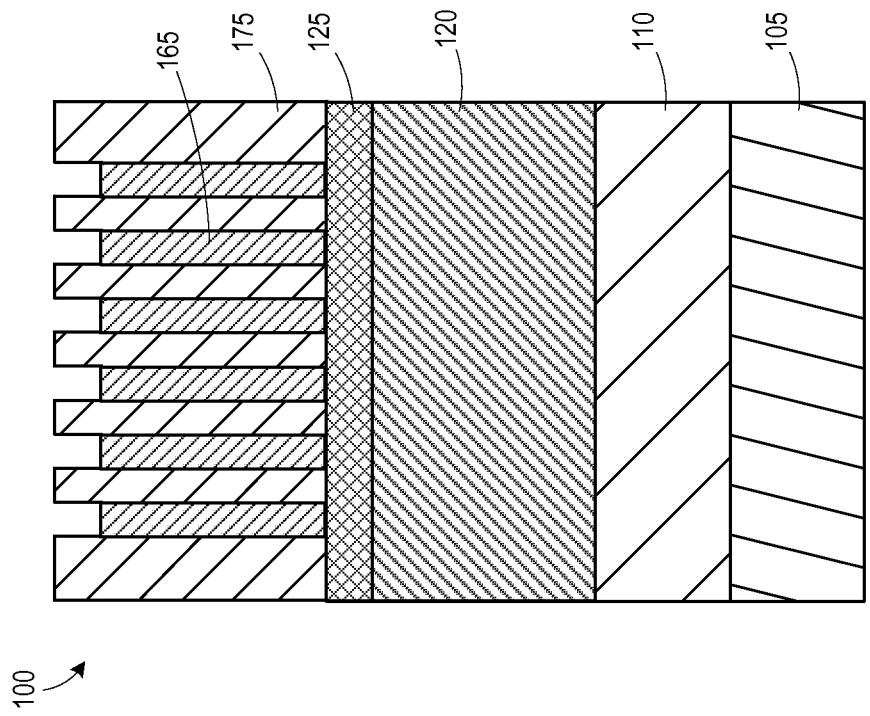
Figure 1D:
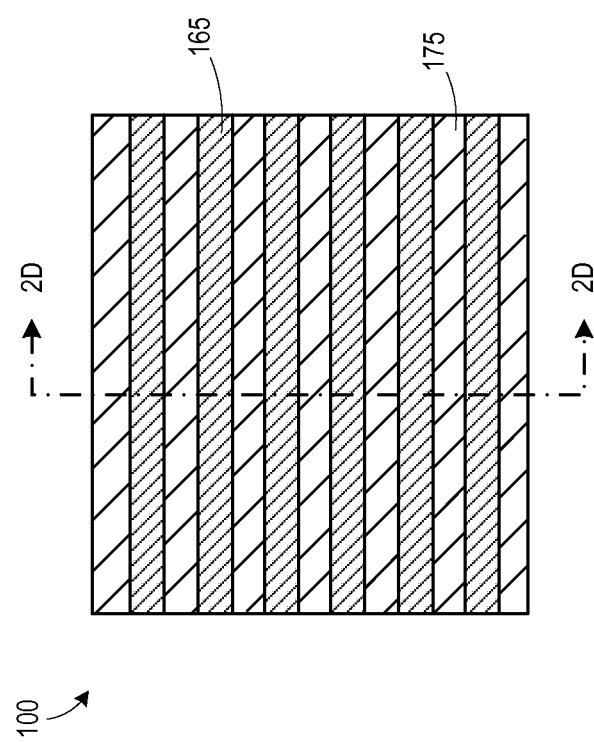

FIGS. 1D and 2D illustrate a top view and a cross-section view (along line 2D), respectively, of the device 100 after an etch process (e.g., selective dry or wet etch) was performed to remove the cap layer 170.

Figure 2E:
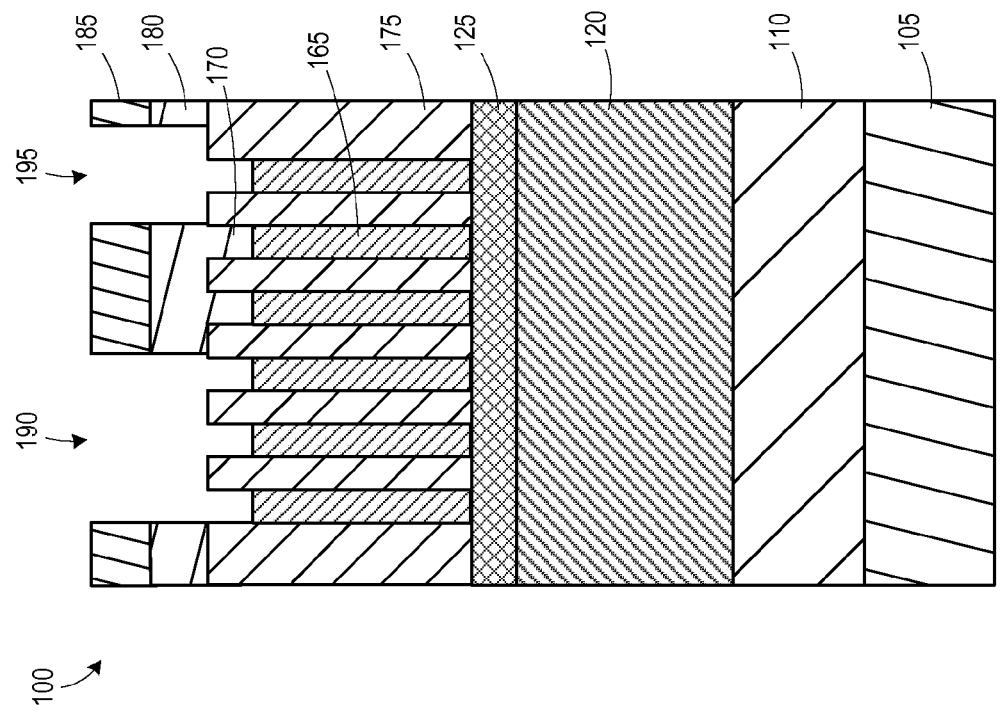
Figure 1E:
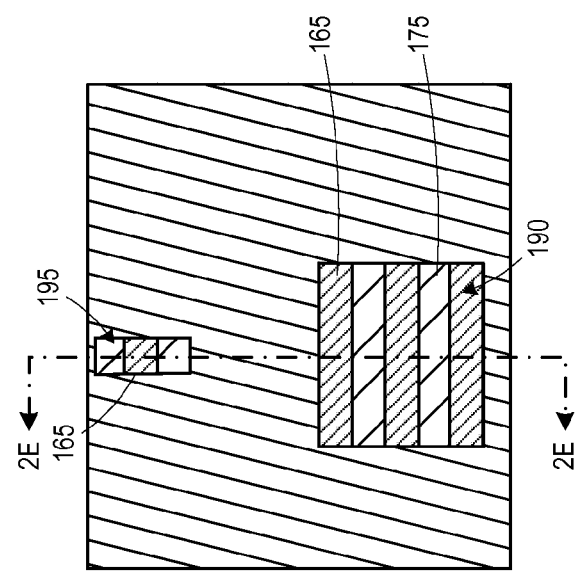

FIGS. 1E and 2E illustrate a top view and a cross-section view (along line 2E), respectively, of the device 100 after a plurality of processes were performed so as to deposit a first hard mask layer 180 (e.g., silicon dioxide) and a second hard mask layer 185 (e.g., silicon nitride) above the second dielectric layer 175 and a patterning process was performed (e.g., using a patterned photoresist layer) to define a line merge opening 190 and a line cut opening 195 in the hard mask layers 180, 185. For ease of illustration, the hard mask layers 180, 185 are illustrated as having planar top surfaces with the cap layer 180 extending into the recesses created by removal of the cap layer 170. However, in an actual implementation, the cap layers 180, 185 would be conformal.

Figure 2F:
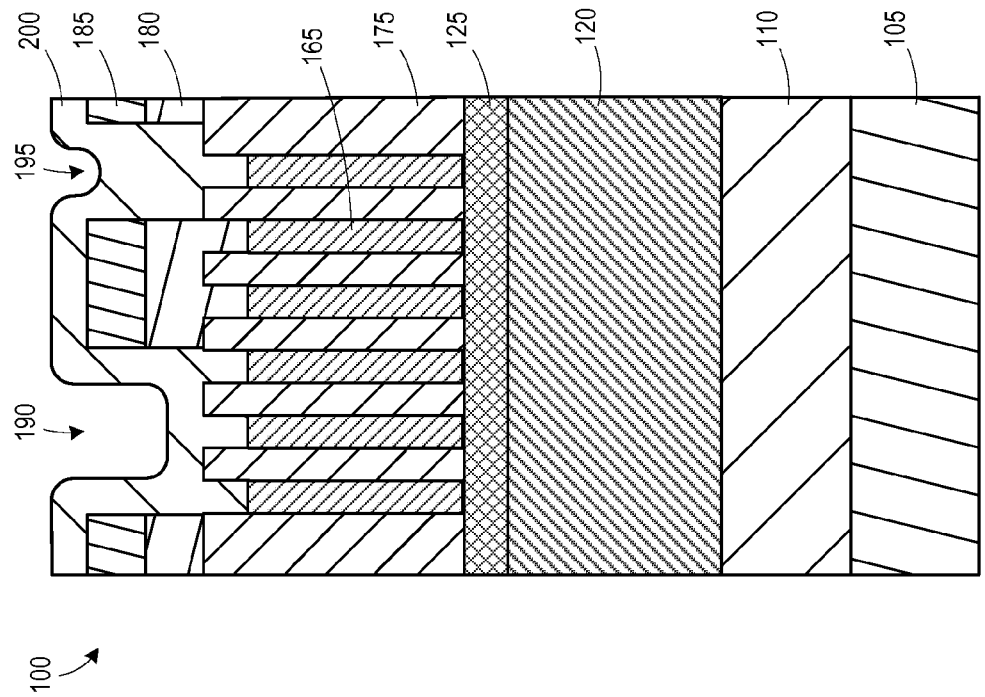
Figure 1F:
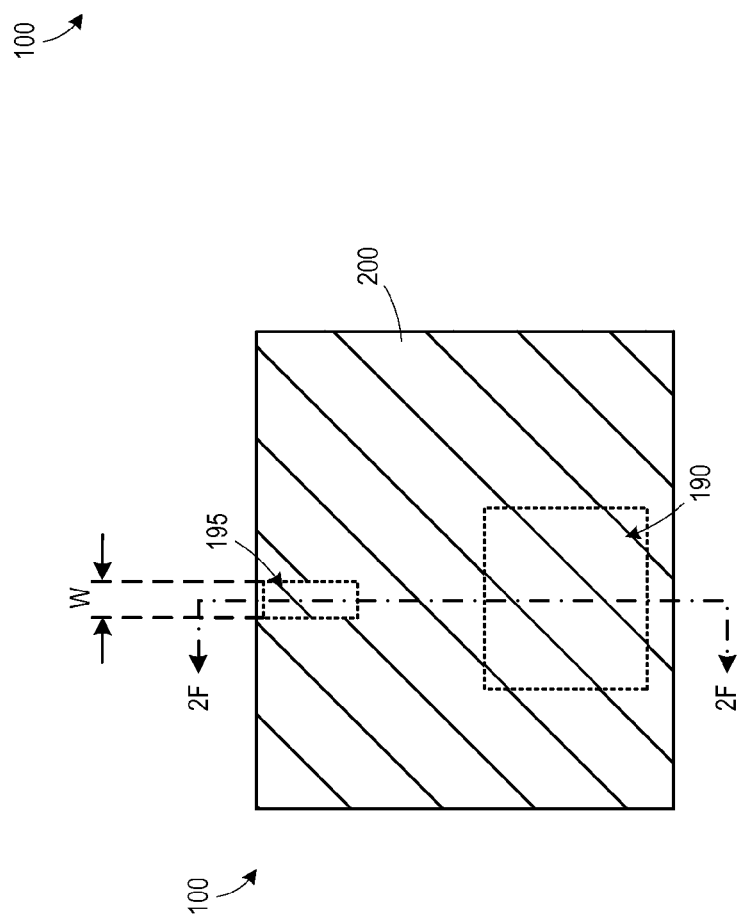

FIGS. 1F and 2F illustrate a top view and a cross-section view (along line 2F), respectively, of the device 100 after a deposition process was performed to deposit a spacer layer 200 (e.g., silicon nitride) above the cap layer 185 and in the openings 190, 195. Due to the greater aspect ratio of the opening 195, it may be almost entirely filled by the spacer layer 200.

Figure 2G:
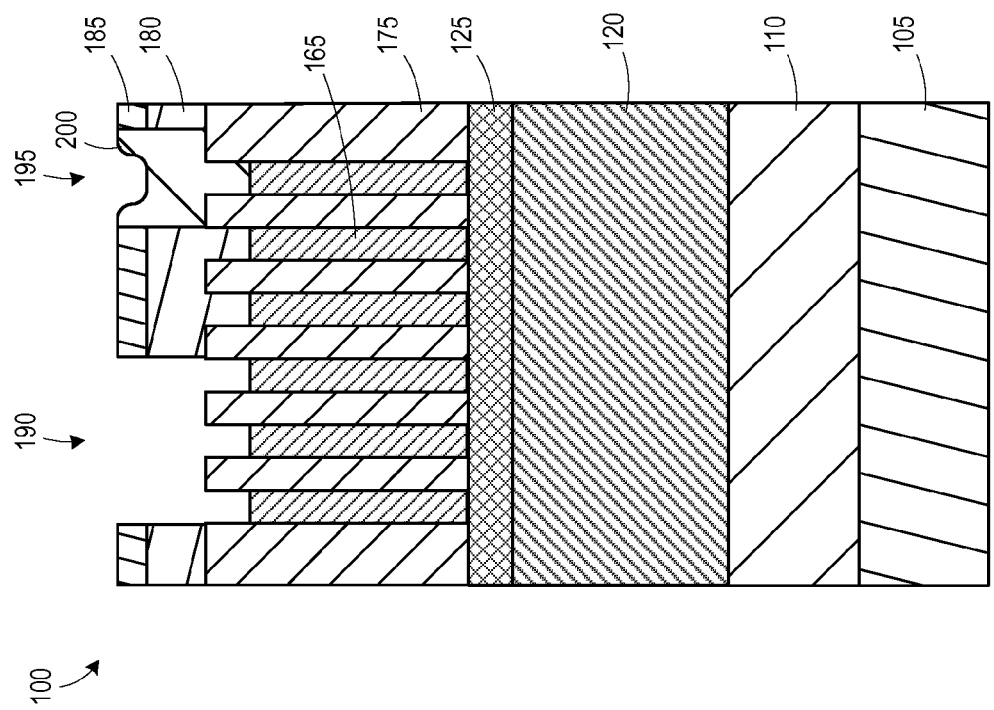
Figure 1G:
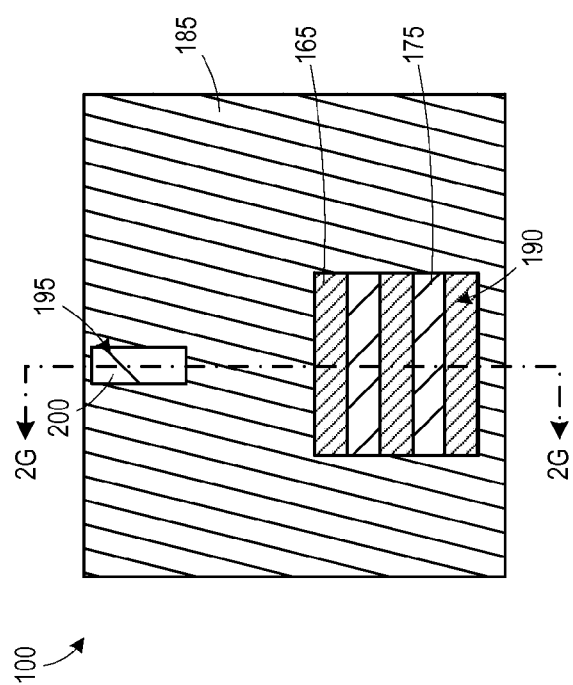

FIGS. 1G and 2G illustrate a top view and a cross-section view (along line 2G), respectively, of the device 100 after an etch process was performed to etch the spacer layer 200 and a portion of the cap layer 185 to clear the opening 190 and expose the sacrificial lines 165, while leaving the opening 195 at least partially filled by a remainder portion of the spacer layer 200. The opening 195 remains at least partially plugged due to its higher aspect ratio. The openings 190, 195 are sized such that some of the material of the spacer layer 200 remains in position in the opening 195 after the spacer material is removed from the opening 190. For example, the thickness of the spacer layer 200 may be about half the width, W, of the opening 195, as illustrated in FIG. 1F.

Figure 2H:
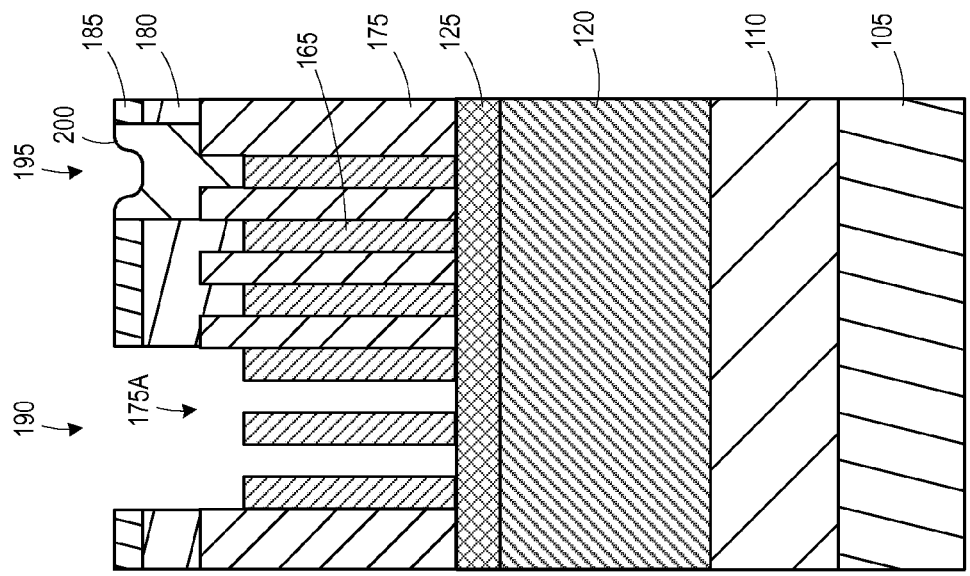
Figure 1H:
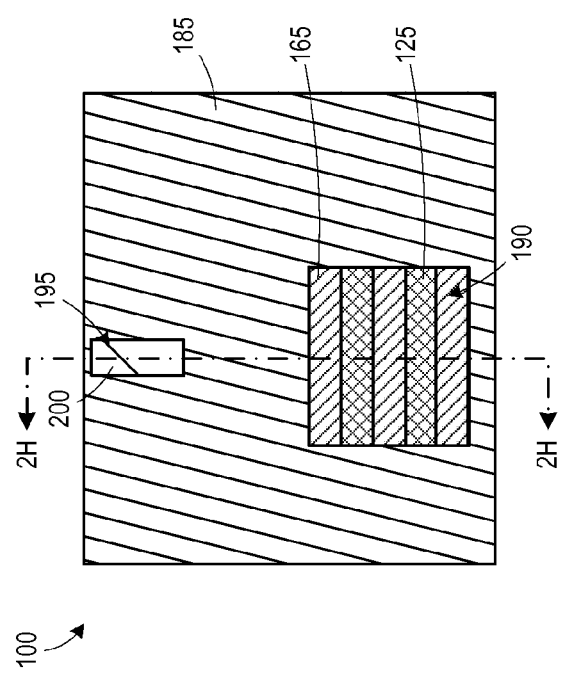

FIGS. 1H and 2H illustrate a top view and a cross-section view (along line 2H), respectively, of the device 100 after an anisotropic etch process was performed to remove the portions of the dielectric layer 175 exposed by the opening 190 and thereby define an opening 175A in the dielectric layer 175. This process operation exposes the underlying cap layer 125. The spacer material 200 in the opening 195 protects the underlying materials and structures during this etching process.

Figure 2I:
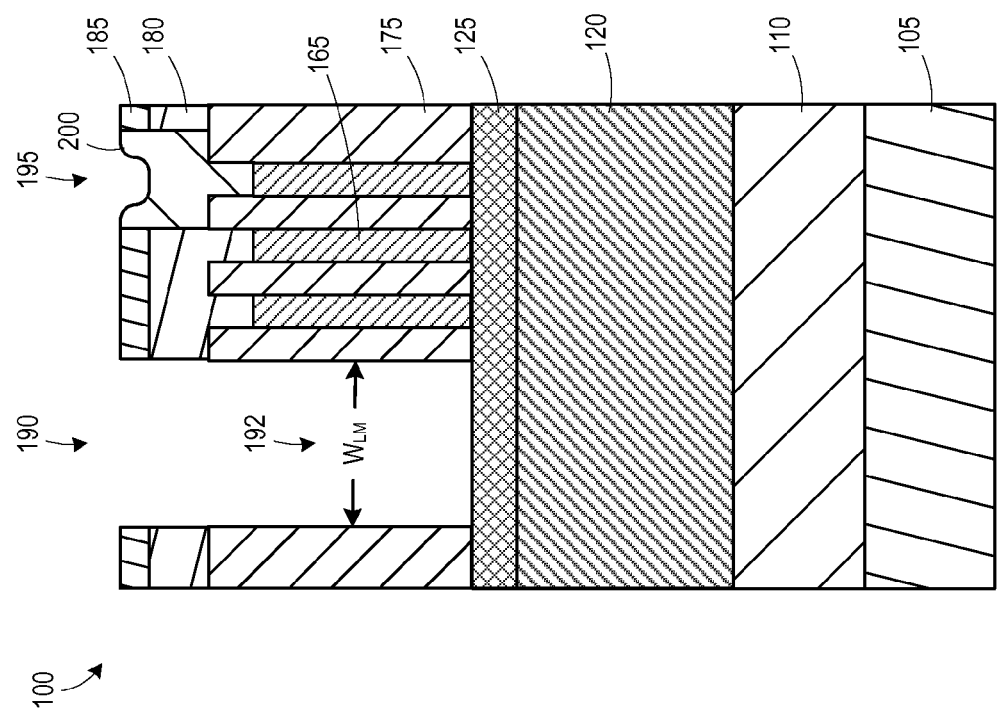
Figure 1I:
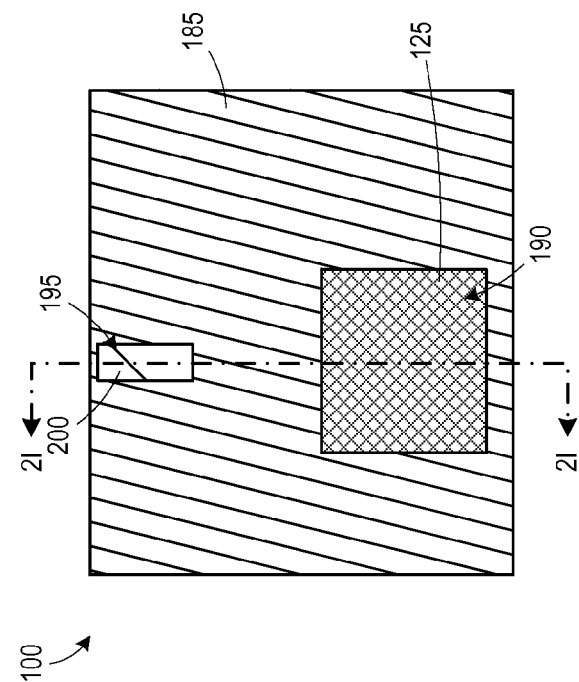

FIGS. 1I and 2I illustrate a top view and a cross-section view (along line 2I), respectively, of the device 100 after an anisotropic etch process was performed to remove the portions of the sacrificial lines 165 exposed by the opening 190. The etch process to remove the exposed portions of the sacrificial lines 165 is referred to as a "line merge etch" as it creates a line merge recess 192 in the dielectric layer 175 having a width, $W_{LM}$, that is greater than the combined widths of the sacrificial lines 165 (e.g., 3 in the depicted example) that are removed when line merge recess 192 is formed and the exposed portions of the sacrificial lines 165 are cut or removed. The line merge recess 192 will be subsequently filled with conductive material to define a line-merging conductive structure an integer number of line widths. In some embodiments, the opening 175A in the dielectric layer 175 may be formed as in FIGS. 1H and 2H, but the exposed sacrificial lines 165 may not be removed immediately after that process operation. Instead, the sacrificial lines 165 may be removed at a later stage, as discussed more fully below.

Figure 2J:
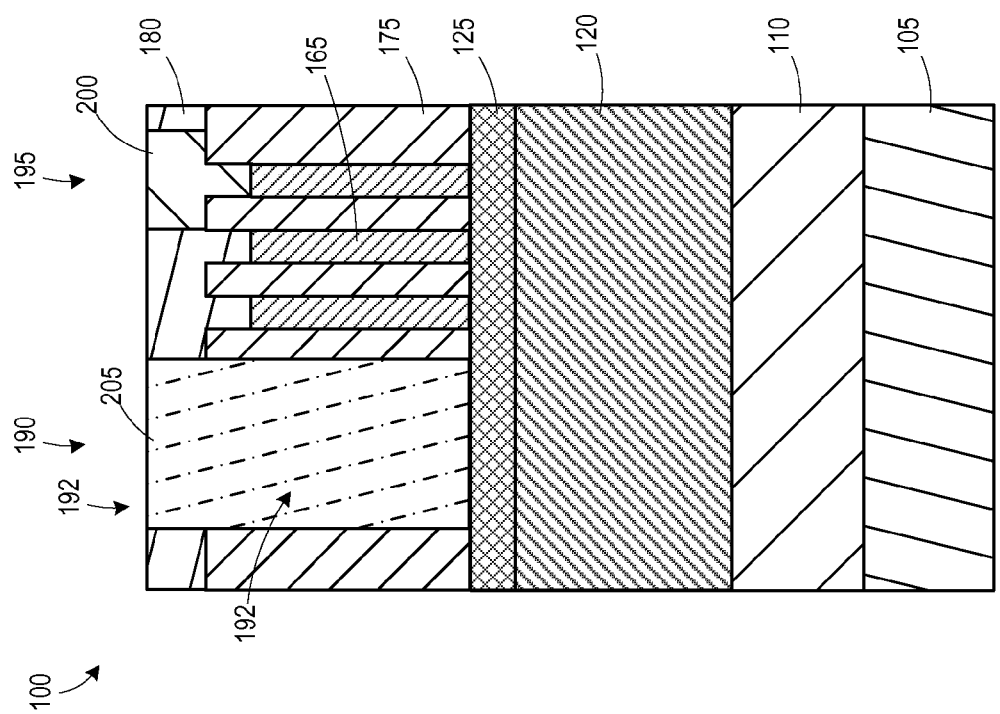
Figure 1J:
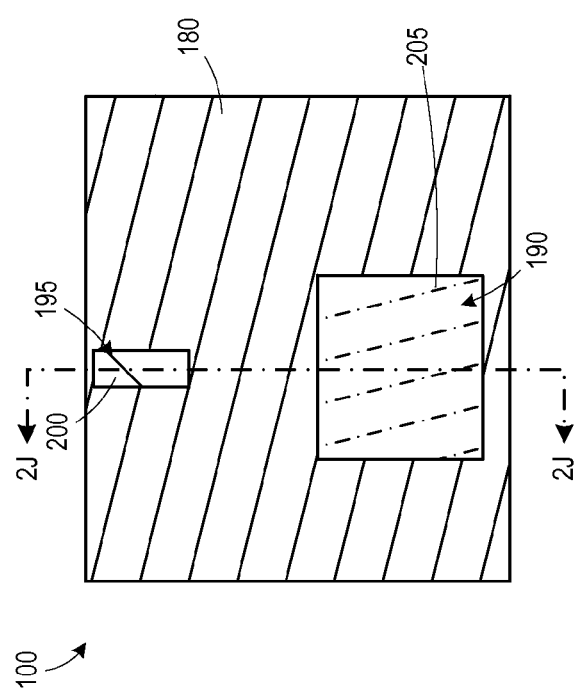

FIGS. 1J and 2J illustrate a top view and a cross-section view (along line 2J), respectively, of the device 100 after a deposition process was performed to deposit a dielectric layer 205 (e.g., silicon dioxide) above the second hard mask layer 185 and in the line merge recess 192 and a planarization process was performed to remove portions of the dielectric layer 205 extending above the second hard mask layer 185 and to remove the second hard mask layer 185, thereby exposing the first hard mask layer 180. After the planarization, the opening 190 and the line merge recess 192 are filled by the dielectric layer 205 and the opening 195 is filled by the remainder portion of the spacer layer 200.

FIGS. 1K and 2K illustrate a top view and a cross-section view (along line 2K), respectively, of the device 100 after a first etch process was performed to remove the remainder portion of the spacer layer 200 to reestablish the opening 195 and a second etch process was performed to remove the portion of the sacrificial line 165 exposed by the opening 195 to define a line cut recess 197 in the dielectric layer 175 that exposes the underlying layer 125. The etch process for removing the exposed portion of the sacrificial line 165 is referred to as a "line cut etch" process as it separates the etched sacrificial lines 165 (shown in phantom) into segments 165A, 165B. The etch process for removing the remainder portion of the spacer layer 200 may be integrated with the line cut etch process. Although the line cut recess 197 only spans a single line in the illustrated example, it may be sized to cover more than one line.

Figure 2L:
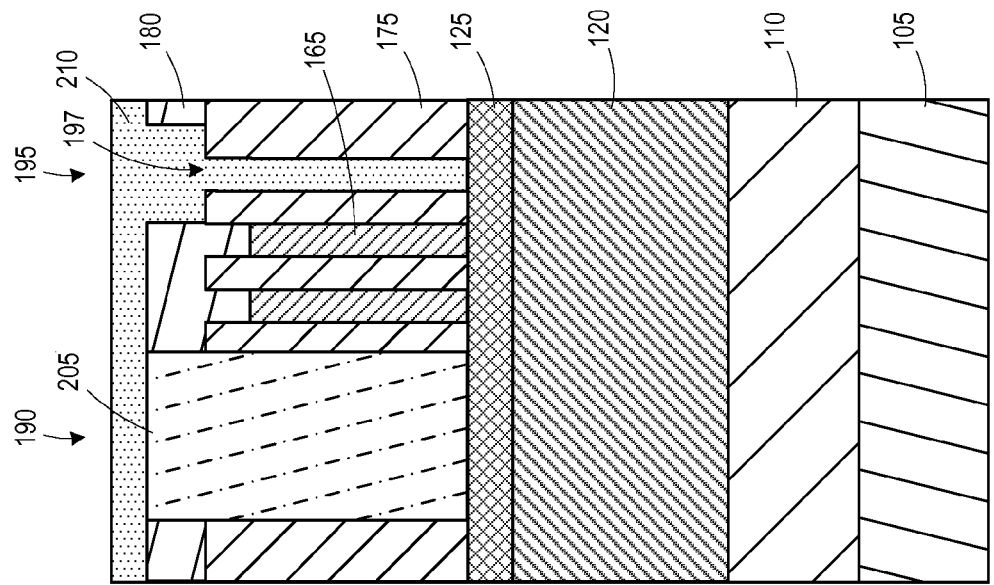
Figure 1L:
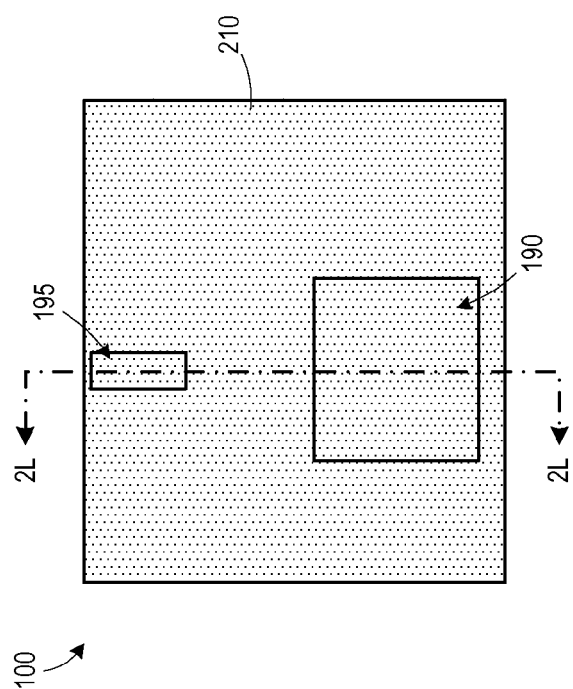

FIGS. 1L and 2L illustrate a top view and a cross-section view (along line 2L), respectively, of the device 100 after a deposition process was performed to form a dielectric layer 210 (e.g., SiOC) in the opening 195 and to fill in the line cut recess 197.

Figure 2M:
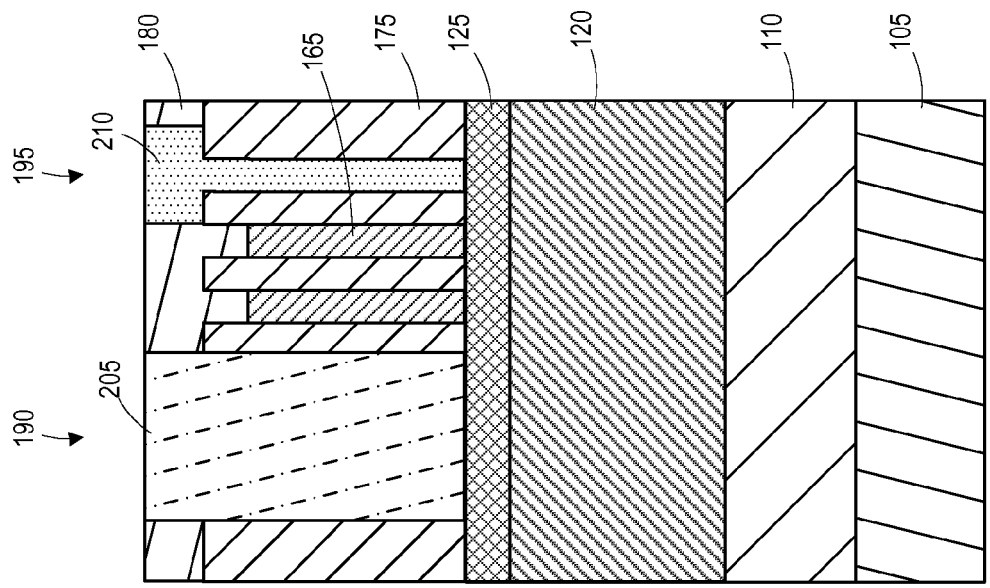
Figure 1M:
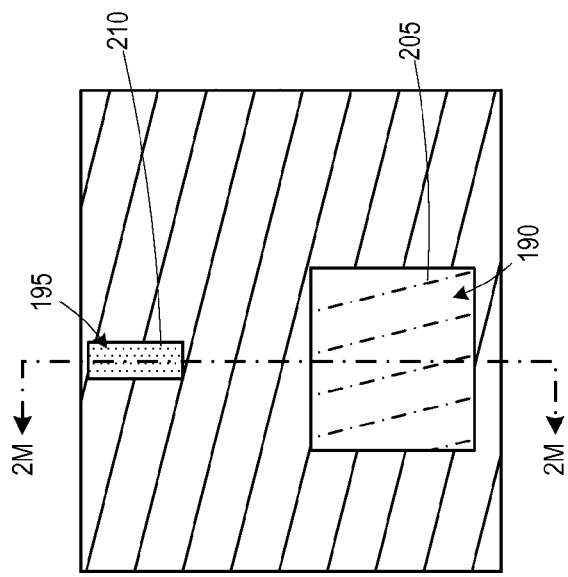

FIGS. 1M and 2M illustrate a top view and a cross-section view (along line 2M), respectively, of the device 100 after a timed etch process was performed to recess the dielectric layer 210 to expose the top surface of the hard mask layer 180 and the dielectric layer 205.

FIGS. 1N and 2N illustrate a top view and a cross-section view (along line 2N), respectively, of the device 100 after one or more wet etching processes were performed to remove the dielectric layer 205 and the hard mask layer 180. In an embodiment where the dielectric layers 175, 210 are SiOC, a diluted HF etch solution may be used to remove silicon dioxide and silicon nitride selectively to the SiOC. In the depicted example, the line merge recess 192 is sized such that it exposes the cap layers 125 that correspond to three illustrative conductive lines 120 in the M1 metallization layer. Of course, the line merge recess 192 may be sized such that the cap layers 125 of any desired number of conductive lines 120 may be exposed by the line merge recess 192.

Figure 2O:
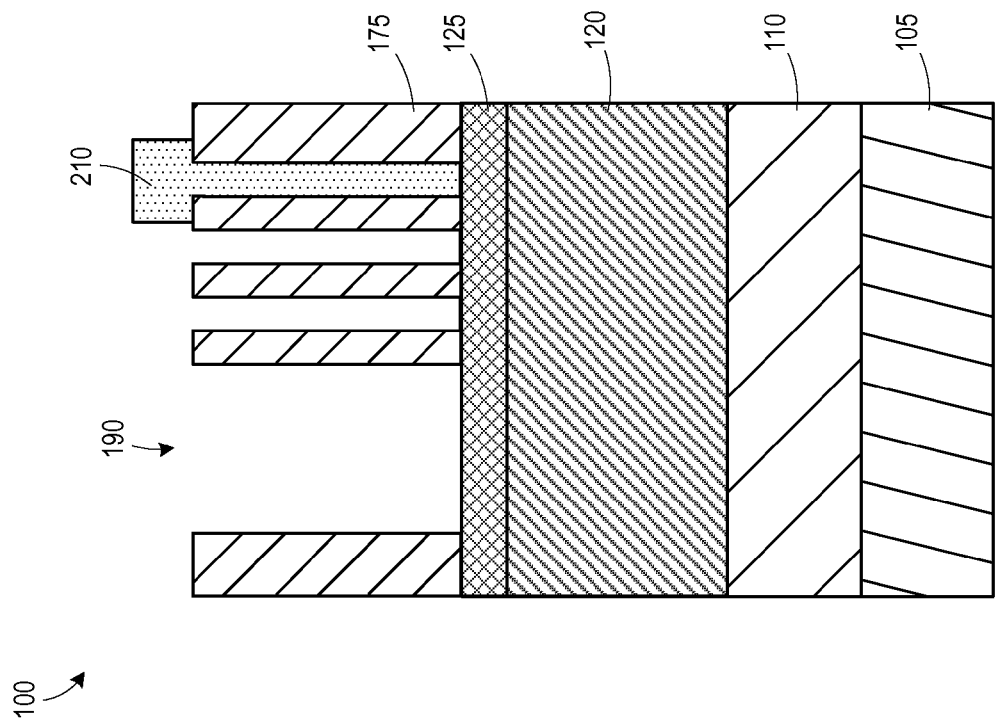
Figure 1O:
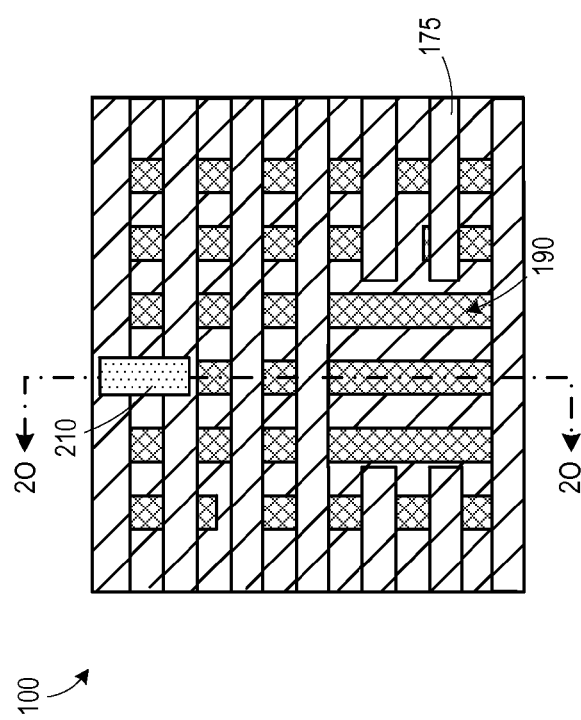

FIGS. 1O and 2O illustrate a top view and a cross-section view (along line 2O), respectively, of the device 100 after an etch process was performed to remove the sacrificial lines 165 thereby exposing the cap layers 125 of the underlying conductive lines 120 in the M1 layer. In some embodiments, if the sacrificial lines 165 in the line merge recess are not removed as described in reference to FIGS. 1I and 2I above, they may be removed here.

Figure 2P:
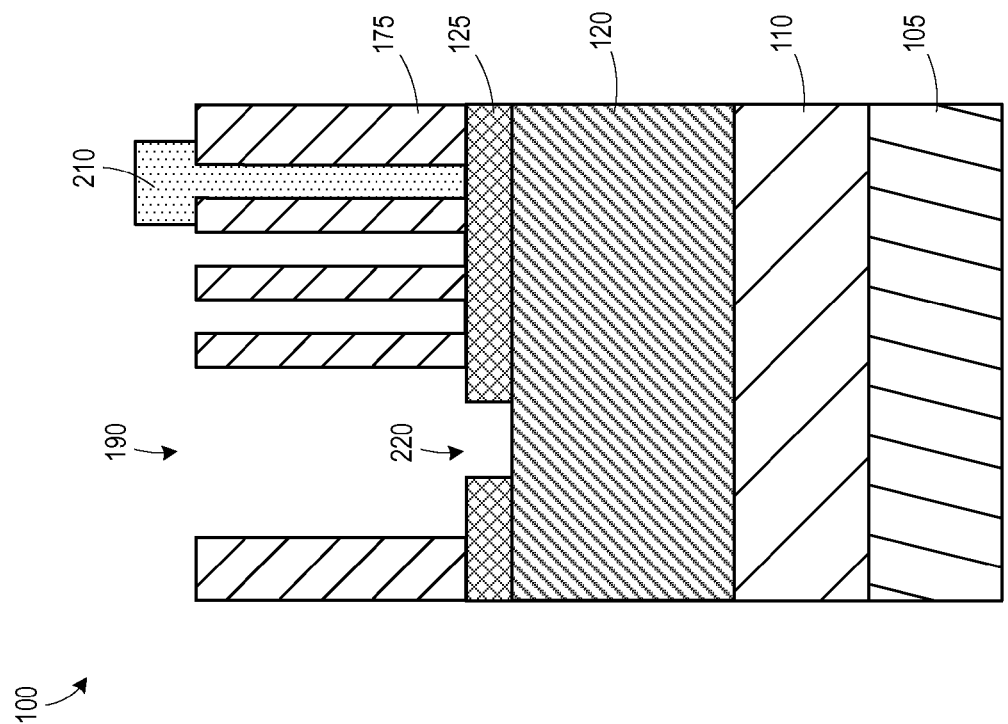
Figure 1P:
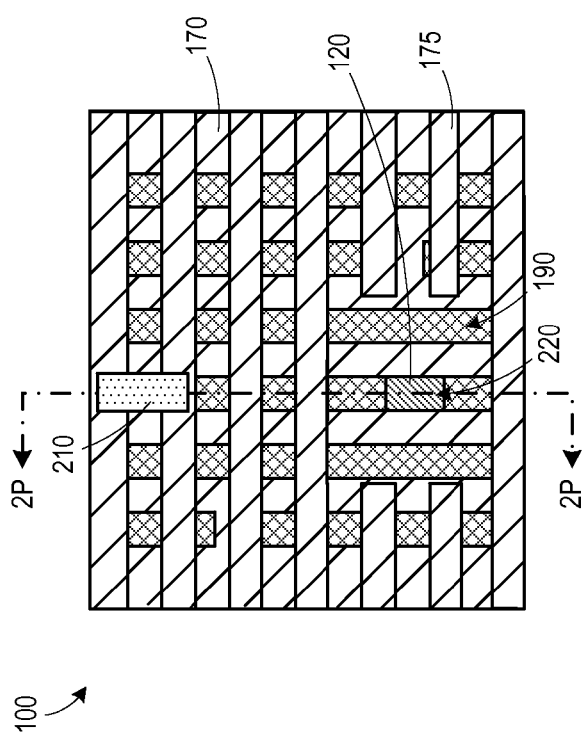

FIGS. 1P and 2P illustrate a top view and a cross-section view (along line 2P), respectively, of the device 100 after a plurality of processes were performed to establish a M1 to M2 interconnections. A photoresist layer (not shown) was formed and patterned to expose a selected portion of the cap layer 125, the exposed portion of the cap layer 125 was etched, and the photoresist layer was stripped, thereby leaving a via opening 220 in the cap layer 125 exposing a portion of the underlying conductive line 120. Although only one example via opening 220 is illustrated, other via openings (not shown) may be provided to contact other M1 conductive lines 120.

Figure 2Q:
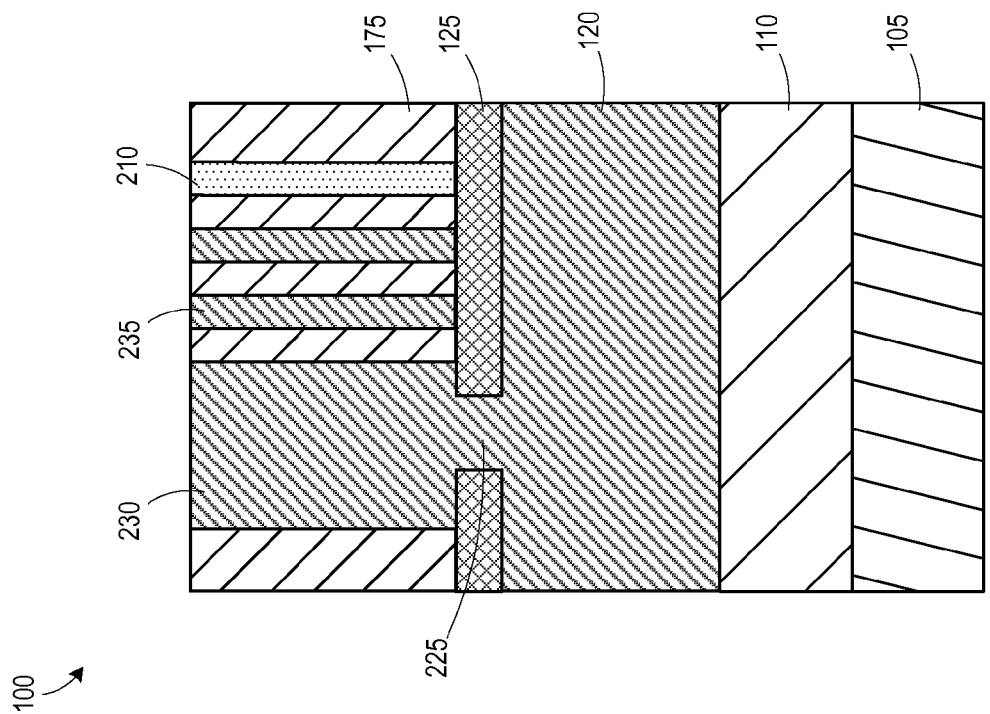
Figure 1Q:
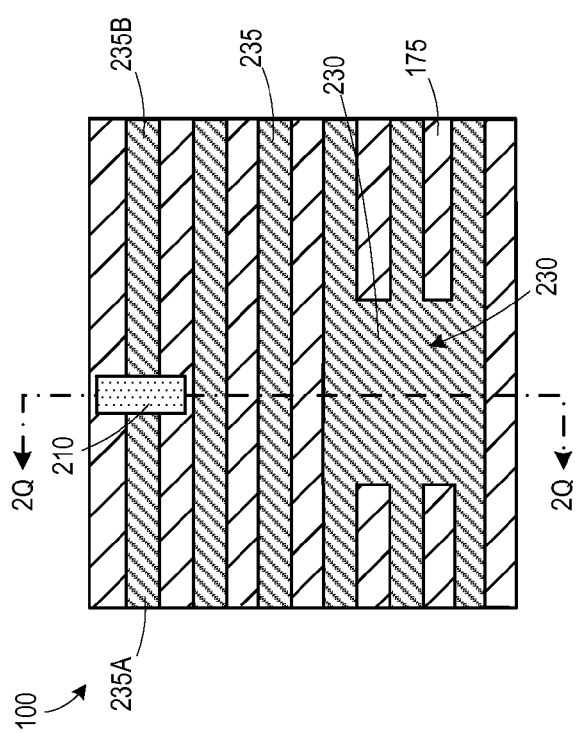

FIGS. 1Q and 2Q illustrate a top view and a cross-section view (along line 2Q), respectively, of the device 100 after a plurality of processes were performed to form a conductive via 225 (in the opening 220—see FIG. 1P) that connects the M1 layer to the M2 layer, a line-merging conductive structure 230 in the line merge recess 192, and a conductive line 235 in the M2 layer. One or more deposition processes were performed so as to over-fill the recesses formed by removing the sacrificial lines 165, the line merge recess 192, and the via opening 220 with a conductive material. Then, a planarization process was performed to remove excess conductive material. The conductive via 225, line-merging conductive structure 230, and conductive lines 235 may include multiple layers, such as one or more barrier layers (e.g., Ta, TaN, TiN, etc.) to prevent migration of any metal into the dielectric layers 115, 175, a metal seed layer (e.g., copper), and a metal fill material (e.g., copper). Conductive lines having segments 235A, 235B are formed where the line cut recess 197 was filled with the dielectric layer 210. The conductive lines 235, 235A, 235B have the characteristic pitch and width of the patterning process and the line-merging conductive structure 230 represents a merged line having an integer number (greater than 1) of characteristic widths. The line-merging conductive structure 230 may be used in a high current application, such as for a power rail.

Subsequent processes may be performed to complete the fabrication of the device 100, such as forming additional metallization layers, die singulation and packaging. The use of the illustrated process to employ a common hard mask for line merges and line cuts simplifies the patterning process by reducing the number of masks and photolithography masks and steps.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method comprising:
    forming a plurality of sacrificial lines embedded in a first dielectric layer formed above a substrate;
    forming a hard mask layer above said first dielectric layer and said plurality of sacrificial lines;
    forming a line merge opening and a line cut opening in said hard mask layer;
    removing portions of said first dielectric layer exposed by said line merge opening to define a line merge recess;
    removing a portion of a selected sacrificial line exposed by said line cut opening to define a line cut recess between first and second segments of said selected sacrificial line;
    forming a second dielectric layer in said line cut recess;
    removing said hard mask; and
    replacing said plurality of sacrificial lines with a conductive material to define at least one line having third and fourth segments in locations previously occupied by said first and second segments, respectively, of said selected sacrificial line and to define a line-merging conductive structure in said line merge recess.

2. The method of claim 1, further comprising:
    forming a spacer layer above said hard mask layer and at least partially in said line merge opening and said line cut opening;
    prior to defining said line merge recess, removing said spacer layer in said line merge opening while leaving a remainder portion of said spacer layer disposed in said line cut opening so as to act as an etch mask when performing an etching process to define said line merge recess; and
    removing said remainder portion of said spacer layer after defining said line merge recess.

3. The method of claim 2, further comprising filling said line merge recess with a dielectric material prior to removing said remainder portion.

4. The method of claim 3, further comprising removing said dielectric material from said line merge recess after forming said second dielectric layer in said line cut recess.

5. The method of claim 3, further comprising removing portions of said sacrificial lines exposed by said first opening prior to filling said line merge recess.

6. The method of claim 3, wherein said hard mask layer comprises a first hard mask layer and a second hard mask layer disposed above said first hard mask layer, and the method further comprises performing a planarizing process to remove said second hard mask layer, to remove portions of said dielectric material extending above said first hard mask layer, and to expose said remainder portion.

7. The method of claim 6, further comprising removing said dielectric material and said first hard mask layer after forming said second dielectric layer in said line cut recess.

8. The method of claim 6, wherein said first hard mask and said dielectric material comprise silicon dioxide and said second hard mask comprises silicon nitride.

9. The method of claim 1, further comprising removing portions of said sacrificial lines exposed by said first opening to define said line merge recess.

10. The method of claim 1, wherein replacing said plurality of sacrificial lines further comprises:
    removing said plurality of sacrificial lines; and
    forming said conductive material in recesses defined by removing said plurality of sacrificial lines and in said line merge recess.

11. The method of claim 1, wherein said first dielectric layer is disposed above a third dielectric layer, a plurality of conductive lines are embedded in said third dielectric layer, cap layers are formed above said plurality of conductive lines, and the method further comprises:
    removing said plurality of sacrificial lines to expose portions of said cap layers of said plurality of conductive lines;
    removing a portion of at least one of said cap layers to define a via recess exposing a selected one of said conductive lines; and
    forming said conductive material in recesses defined by removing said plurality of sacrificial lines, in said line merge recess, and in said via recess.

12. A method comprising:
    forming a plurality of sacrificial lines embedded in a first dielectric layer formed above a substrate;
    forming a hard mask layer above said first dielectric layer and said plurality of sacrificial lines;
    forming first and second openings in said hard mask layer;
    forming a spacer layer above said hard mask layer and at least partially in said first and second openings;
    removing said spacer layer in said first opening while leaving a remainder portion of said spacer layer disposed in said second opening;
    removing portions of said first dielectric layer exposed by said first opening to define a line merge recess;
    removing said remainder portion of said spacer layer disposed in said second opening;

removing a portion of a selected sacrificial line exposed by said second opening to define a line cut recess between first and second segments of said selected sacrificial line;

forming a second dielectric layer in said line cut recess; and replacing said plurality of sacrificial lines with a conductive material to define at least one line having third and fourth segments in locations previously occupied by said first and second segments and to define a line-merging conductive structure having a width greater than said at least one line in said line merge recess.

13. The method of claim 12, further comprising filling said line merge recess with a dielectric material prior to removing said remainder portion.

14. The method of claim 12, further comprising removing said dielectric material from said line merge recess after forming said second dielectric layer in said line cut recess.

15. The method of claim 12, further comprising removing portions of said sacrificial lines exposed by said first opening prior to filling said line merge recess.

16. The method of claim 12, wherein said hard mask layer comprises a first hard mask layer and a second hard mask layer disposed above said first hard mask layer, and the method further comprises performing a planarizing process to remove said second hard mask layer, to remove portions of said dielectric material extending above said first hard mask layer, and to expose said remainder portion.

17. The method of claim 16, further comprising removing said dielectric material and said first hard mask layer after forming said second dielectric layer in said line cut recess.

18. The method of claim 12, further comprising removing portions of said sacrificial lines exposed by said first opening to define said line merge recess.

19. The method of claim 12, wherein replacing said plurality of sacrificial lines further comprises:

removing said plurality of sacrificial lines; and forming said conductive material in recesses defined by removing said plurality of sacrificial lines and in said line merge recess.

20. The method of claim 12, wherein said first dielectric layer is disposed above a third dielectric layer, a plurality of conductive lines are embedded in said third dielectric layer, cap layers are formed above said plurality of conductive lines, and the method further comprises:

removing said plurality of sacrificial lines to expose portions of said cap layers of said plurality of conductive lines;

removing a portion of at least one of said cap layers to define a via recess exposing a selected one of said conductive lines; and forming said conductive material in recesses defined by removing said plurality of sacrificial lines, in said line merge recess, and in said via recess.

* * * * *